(12) United States Patent
Chu et al.

(10) Patent No.: US 11,587,993 B2
(45) Date of Patent: Feb. 21, 2023

(54) DISPLAY PANEL INCLUDING BARRIER HOLES FORMED THROUGH STACK OF PLANARIZATION LAYER AND PIXEL DEFINING LAYER

(71) Applicant: Shenzhen China Star Optoelectronics Semiconductor Display Technology Co., Ltd., Shenzhen (CN)

(72) Inventors: Jinxing Chu, Shenzhen (CN); Jinchuan Li, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 290 days.

(21) Appl. No.: 16/627,313

(22) PCT Filed: Dec. 17, 2019

(86) PCT No.: PCT/CN2019/125880
§ 371 (c)(1),
(2) Date: Dec. 29, 2019

(87) PCT Pub. No.: WO2021/109235
PCT Pub. Date: Jun. 10, 2021

(65) Prior Publication Data
US 2021/0327978 A1 Oct. 21, 2021

(30) Foreign Application Priority Data
Dec. 6, 2019 (CN) .......................... 201911243020.0

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 51/5259* (2013.01); *H01L 51/56* (2013.01); *H01L 2227/323* (2013.01)

(58) Field of Classification Search
CPC .. H01L 27/3246; H01L 51/5259; H01L 51/56
(Continued)

(56) References Cited

U.S. PATENT DOCUMENTS

| 2014/0319474 A1 | 10/2014 | Kim et al. |
| 2016/0043346 A1 | 2/2016 | Kamiya et al. |
| 2016/0064686 A1* | 3/2016 | Odaka ................. H01L 51/5246 257/89 |

FOREIGN PATENT DOCUMENTS

| CN | 108538901 | 9/2018 |
| CN | 109087935 | 12/2018 |

(Continued)

OTHER PUBLICATIONS

"Opening." Cambridge Dictionary, Cambridge University Press, https://dictionary.cambridge.org/us/dictionary/english/opening (Year: 2022).*

*Primary Examiner* — Matthew E. Gordon

(57) ABSTRACT

A display panel and a manufacturing method thereof are provided in the present application. The display panel includes a substrate, a planarization layer disposed on the substrate, and a pixel definition layer disposed on the planarization layer. The display panel includes a test region, wherein a plurality of virtual pixel openings are disposed in the pixel definition layer positioned in the test region, and a plurality of barrier holes in a one-to-one correspondence to the virtual pixel openings are disposed in the planarization layer positioned in the test region, and a barrier layer fills each of the barrier holes.

9 Claims, 3 Drawing Sheets

(58) Field of Classification Search
USPC .......................................................... 257/40
See application file for complete search history.

(56) References Cited

FOREIGN PATENT DOCUMENTS

| CN | 110854289 | | 2/2020 | | |
|---|---|---|---|---|---|
| KR | 20170005320 A | * | 1/2017 | ........... | H01L 27/326 |

* cited by examiner

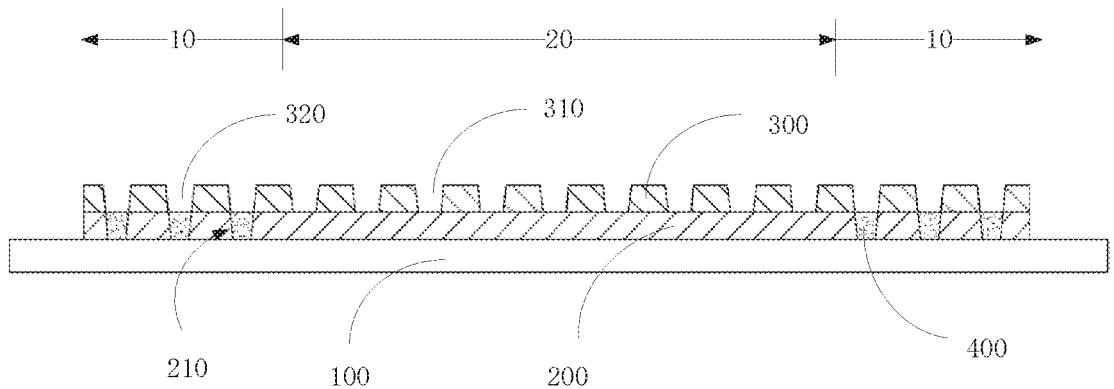

FIG. 1

```
┌─────────────────────────────────────────────────────┐
│ providing a substrate, forming a planarization layer on the │  Step S10
│ substrate, the display panel includes virtual pixel region  │
└─────────────────────────────────────────────────────┘
                            │
                            ▼
┌─────────────────────────────────────────────────────┐
│ forming a pixel definition layer on the planarization layer, and │  Step S20
│ forming a plurality of virtual pixel openings in the planarization │
│ layer positioned in the virtual pixel region                │
└─────────────────────────────────────────────────────┘
                            │
                            ▼
┌─────────────────────────────────────────────────────┐
│ forming a plurality of barrier holes in a one-to-one correspondence │  Step S30
│ to the virtual pixel openings in the planarization layer positioned │
│ in the virtual pixel region, and forming a barrier layer in each of │
│ the barrier holes                                           │
└─────────────────────────────────────────────────────┘
```

FIG. 2

DISPLAY PANEL INCLUDING BARRIER HOLES FORMED THROUGH STACK OF PLANARIZATION LAYER AND PIXEL DEFINING LAYER

RELATED APPLICATIONS

This application is a National Phase of PCT Patent Application No. PCT/CN2019/125880 having International filing date of Dec. 17, 2019, which claims the benefit of priority of Chinese Patent Application No. 201911243020.0 filed on Dec. 6, 2019. The contents of the above applications are all incorporated by reference as if fully set forth herein in their entirety.

FIELD AND BACKGROUND OF THE INVENTION

The present application relates to the technical field of display panels, and in particular, to a display panel and a manufacturing method thereof.

Organic light-emitting devices (OLEDs) have attracted much attention in the industry due to self-luminous, low driving voltages, fast response times, and wide viewing angles, etc. At present, most OLED devices are fabricated by evaporation or inkjet printing technology, regardless of whether evaporation technology or inkjet printing technology is used, a dummy region needs to be set around a display region to ensure that pixels in a light-emitting region emit light uniformly.

A conventional test region (dummy region) contains organic material layers such as pixel definition layer and planarization layer, and is positioned inside an encapsulation region. Due to the poor water resistance of organic materials, it is easy to form water vapor intrusion channels and affect the encapsulating effect. In addition, the test region requires a certain width, which is also not convenient to the design of a narrow border encapsulation.

SUMMARY OF THE INVENTION

The embodiments of the present application provide a display panel and a manufacturing method thereof to solve the problem of organic material layers, such as a pixel definition layer and a planarization layer in the conventional test region (dummy region) of display panels, having the poor water resistance, which is easy to form water vapor intrusion channels and affect encapsulation stability, and is not convenient to narrow border encapsulation.

An embodiment of the present application provides a display panel including a test region;

wherein the display panel includes a substrate, a planarization layer disposed on the substrate, and a pixel definition layer disposed on the planarization layer;

wherein a plurality of virtual pixel openings are disposed in the pixel definition layer positioned in the test region, a plurality of barrier holes in a one-to-one correspondence to the virtual pixel openings are disposed in the planarization layer positioned in the test region, and a barrier layer fills each of the barrier holes.

In the display panel according to the embodiment of the present application, the display panel further including a display region, wherein the test region extends from an edge of the pixel definition layer and surrounds the display region, and a plurality of pixel openings are disposed in the pixel definition layer positioned in the display region.

In the display panel according to the embodiment of the present application, a size of each of the pixel openings is equal to a size of each of the virtual pixel openings.

In the display panel according to the embodiment of the present application, each of the barrier holes is connected to a corresponding one of the virtual pixel openings.

In the display panel according to the embodiment of the present application, an opening size of the barrier hole close to a side of the pixel definition layer is equal to an opening size of the virtual pixel opening close to a side of the planarization layer.

In the display panel according to the embodiment of the present application, a material of the barrier layer is a hygroscopic agent.

In the display panel according to the embodiment of the present application, a thickness of the barrier layer is equal to a thickness of the planarization layer.

In the display panel according to the embodiment of the present application, the display panel further includes a light-emitting function layer disposed on the planarization layer and the pixel definition layer, and a thin film encapsulation layer disposed on the substrate and the light-emitting function layer and covering the light-emitting function layer.

According to the above purpose of the present application, the present embodiment further provides a method of manufacturing a display panel, including the following steps:

providing a substrate, wherein the display panel includes a display region and a test region;

forming a planarization layer on the substrate;

forming a pixel definition layer on the planarization layer, and forming a plurality of virtual pixel openings in the test region on the pixel definition layer; and forming a plurality of barrier holes in a one-to-one correspondence to the virtual pixel openings in the planarization layer positioned in the test region, and forming a barrier layer in each of the barrier holes.

In the manufacturing method of the display panel according to the embodiment of the present application, a barrier layer is formed in each of the barrier holes by inkjet printing or other coating methods.

In the manufacturing method of the display panel according to the embodiment of the present application, the test region is formed along an edge of the pixel definition layer and is formed outside the display region, and after the pixel definition layer is formed on the planarization layer, the method further includes:

forming a plurality of pixel openings in the pixel definition layer positioned in the display region.

In the manufacturing method of the display panel according to the embodiment of the present application, the pixel openings and the virtual pixel openings are manufactured by a same process.

In the manufacturing method of the display panel according to the embodiment of the present application, the pixel openings, the virtual pixel openings, and the barrier hole are made in a same photolithography process through a halftone photomask.

A display panel and a manufacturing method thereof provided in the embodiments of the present application are provided with a plurality of barrier holes in a planarization layer and a structure in which a barrier layer is filled in each of the barrier holes, so that water-oxygen barrier regions are formed within the planarization layer. It can effectively enhance the encapsulating effect, also the abovementioned structure uses the film layer in the test region reasonably, which is equivalent to increasing the effective area of the encapsulation. As a result, an area occupied by the subsequent encapsulating can be effectively reduced, and is more convenient for the narrow border design. In addition, the manufacturing method of the display panel is simple and suitable for batch production.

BRIEF DESCRIPTION OF THE SEVERAL VIEWS OF THE DRAWINGS

The technical scheme and other beneficial effects of this application will be obvious through the detailed description of the specific implementation of this application in combination with the attached drawings below.

FIG. 1 is a schematic structural diagram of a display panel according to an embodiment of the present application.

FIG. 2 is a schematic flowchart showing a method of manufacturing a display panel according to an embodiment of the present application.

DESCRIPTION OF SPECIFIC EMBODIMENTS OF THE INVENTION

Figure 3:
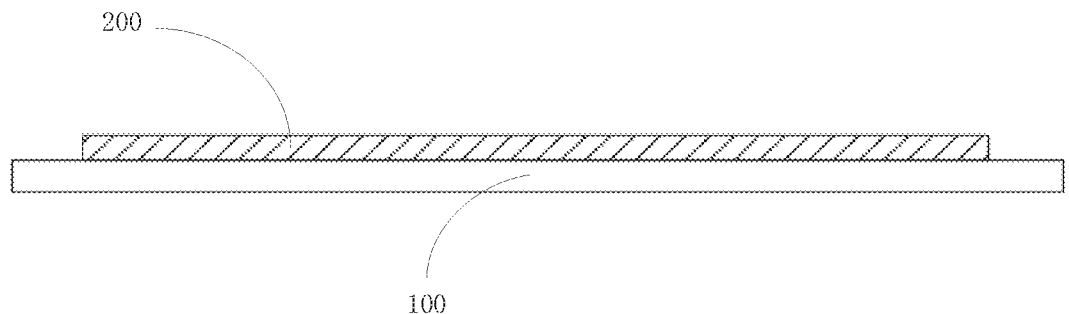
FIG. 3, FIG. 4, FIG. 5, FIG. 6 and FIG. 7 are structural diagrams showing the flowchart of the method of manufacturing the display panel according to an embodiment of the present application.

The following content combines with the drawings and the embodiment for describing the present invention in detail. It is obvious that the following embodiments are only some embodiments of the present invention. For the skilled persons of ordinary skill in the art without creative effort, the other embodiments obtained thereby are still covered by the present invention.

In the description of the present invention, it is to be understood that the terms such as "center", "longitudinal", "transverse", "length", "width", "thickness", "upper", "lower", "front", "rear", "left", "right", "vertical", "horizontal", "top", "bottom", "inside", "outside", "clockwise", "counterclockwise", etc., the orientation or positional relationship of the indications is based on the orientation or positional relationship shown in the drawings, and is merely for the convenience of the description of the invention and the simplified description, rather than indicating or implying that the device or component referred to has a specific orientation, in a specific orientation. The construction and operation are therefore not to be construed as limiting the invention.

In addition, unless otherwise defined, any technical or scientific term used herein shall have the common meaning understood by a person of ordinary skills. Such words as "first" and "second" used in the specification and claims are merely used to differentiate different components rather than to represent any order, number or importance. In the description of the present invention, the meaning of "plurality" is two or more unless specifically defined otherwise. In addition, the terms "first" and "second" are used for descriptive purposes only and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless it is specifically and specifically defined otherwise.

In the description of this application, it should be noted that the terms "installation", "connected", and "coupled" should be understood in a broad sense, unless explicitly stated and limited otherwise. For example, they may be fixed connections, removable connected or integrally connected; it can be mechanical, electrical, or can communicate with each other; it can be directly connected, or it can be indirectly connected through an intermediate medium, it can be an internal communication of two elements or an interaction relationship of two elements. For those of ordinary skill in the art, the specific meanings of the above terms in this application can be understood according to specific situations. In the present invention, the first feature "on" or "under" the second feature can include direct contact of the first and second features, and can also be included that the first and second features are not in direct contact but are contacted by additional features between them, unless otherwise specifically defined and defined. Moreover, the first feature is "above", "on", and "on the top of" of the second feature, including the first feature directly above and diagonally above the second feature, or simply means that the first feature is horizontally higher than the second feature. The first feature is "under", "below", and "beneath" the second feature, including the first feature directly below and diagonally below the second feature, or merely the first feature is horizontally less than the second feature.

The following disclosure provides many different implementations or examples for implementing different structures of the present application. To simplify the disclosure of this application, the components and settings of specific examples are described below. Of course, they are merely examples and are not intended to limit the application. Furthermore, the present application may repeat reference numbers and/or reference letters in different examples, and such repetition is for the sake of simplicity and clarity, and does not by itself indicate a relationship between the various embodiments and/or settings discussed. In addition, examples of various specific processes and materials are provided in this application, but those of ordinary skill in the art can be aware of the application of other processes and/or the use of other materials.

Specifically, referring to FIG. 1, an embodiment of the present application provides a display panel including a test region 10.

The display panel includes a substrate 100, a planarization layer 200 disposed on the substrate 100, and a pixel definition layer 300 disposed on the planarization layer 200.

A plurality of virtual pixel openings 320 are disposed in the pixel definition layer 300 positioned in the test region 10, a plurality of barrier holes 210 in a one-to-one correspondence to the virtual pixel openings 320 are disposed in the planarization layer 200 positioned in the test region 10, and a barrier layer 400 fills each of the barrier holes 210.

It can be understood that the barrier holes 210 and the barrier layers 400 are specifically configured to cooperate with an encapsulation structure in the display panel, such as a thin film encapsulation layer. In one embodiment, the substrate 100 includes a thin film transistor (TFT) function layer. The display panel further includes a light-emitting function layer disposed on the planarization layer 200 and the pixel definition layer 300. The thin film encapsulation layer is disposed on the substrate 100 and the light-emitting function layer, and covers the light-emitting function layer. Due to the organic material layers such as the pixel definition layer 300 and the planarization layer 200 have poor water resistance, and it is easy to form water vapor intrusion channels. And the barrier holes 210 and the barrier layers 400 are used to form water-oxygen barrier regions in the test region 10, which fully utilizes the space in that region. It can effectively reduce the occupied area of other encapsulation structures, which is convenient to narrow border encapsulation and more convenient to the narrow border structure design of display panels.

In an embodiment, the display panel further includes a display region. The test region 10 extends from an edge of the pixel definition layer 300 and surrounds the display region 20. A plurality of pixel openings 310 are disposed in the pixel definition layer 300 positioned in the display region 20, and a size of each of the pixel openings 310 is equal to a size of each of the virtual pixel openings 320. It can be understood that the pixel openings 310 and the virtual pixel openings 320 are manufactured by a same process.

In one embodiment, each of the barrier holes 210 is connected to a corresponding one of the virtual pixel openings 320, and an opening size of the barrier hole 210 close to a side of the pixel definition layer 300 is equal to an opening size of the virtual pixel opening 320 close to a side of the planarization layer 200. It can be understood that a sidewall of the barrier hole 210 is in smooth transition with a sidewall of the corresponding virtual pixel opening 320.

In an embodiment, the material of the barrier layer 400 can be a material having a function of absorbing water or oxygen. Specifically, the material of the barrier layer 400 is a hygroscopic agent. A thickness of the barrier layer 400 and a thickness of the planarization layer 200 is equal, so that the barrier layer 400 is flush with an upper surface of the planarization layer 200.

In summary, the display panel of the present application has a structure in which barrier holes 210 are formed in the planarization layer 200 and a structure in which a barrier layer 400 is filled in each of the barrier holes 210, so that water-oxygen barrier regions are formed within the planarization layer 200. It can effectively enhance the encapsulating effect, also the abovementioned structure uses the film layer in the test region 10 reasonably, which is equivalent to increasing the effective area of the encapsulation. As a result, an area occupied by the subsequent encapsulating can be effectively reduced, and is more convenient for the narrow border design.

Figure 4:
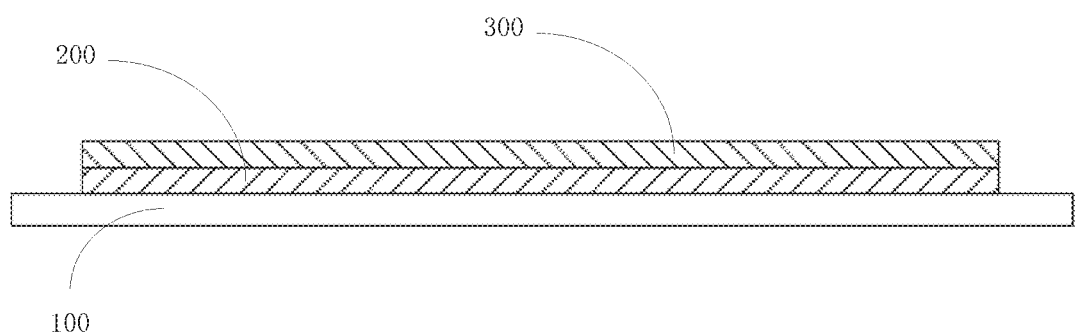
Figure 5:
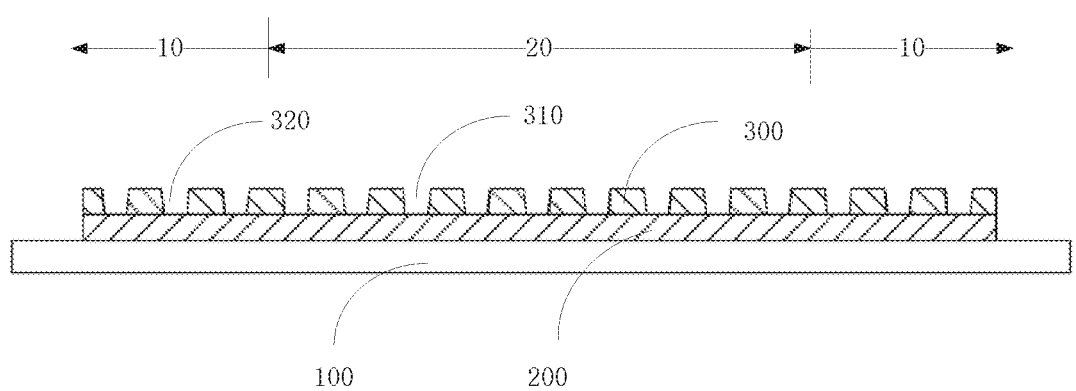
Figure 6:
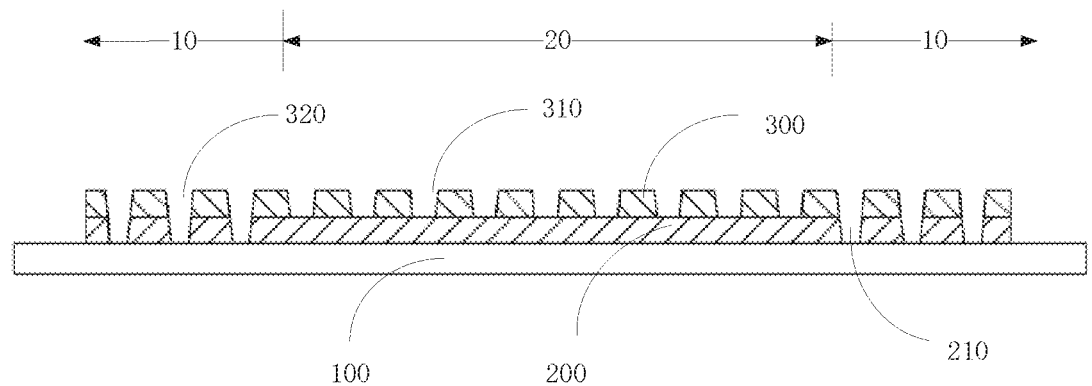
Figure 7:
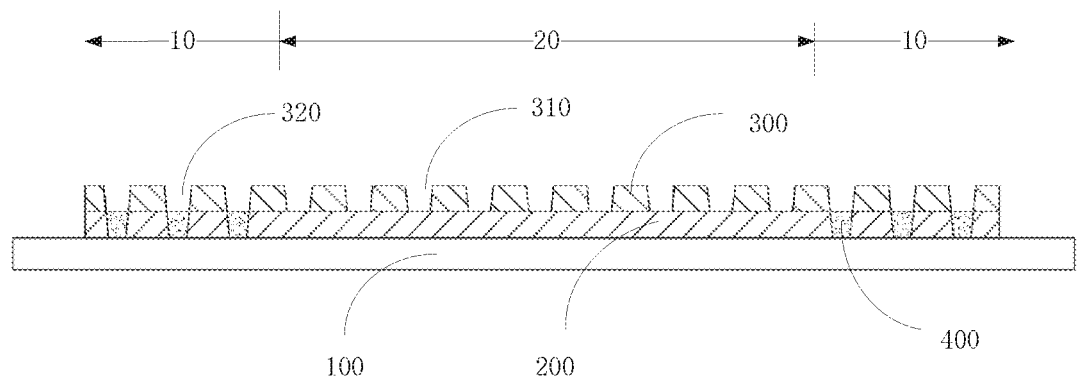

According to the above purpose of the present application, the present embodiment further provides a method of manufacturing a display panel, as shown in FIG. 2, including the following steps:

step S10, as shown in FIG. 3, providing a substrate 100, and forming a planarization layer 200 on the substrate 100, wherein the display panel includes a display region 20 and a test region 10;

step S20, as shown in FIGS. 4 and 5, forming a pixel definition layer 300 on the planarization layer 200, and forming a plurality of virtual pixel openings 320 in the pixel definition layer 300 positioned in the test region 10; and step S30, as shown in FIG. 6 to FIG. 7, forming a plurality of barrier holes 210 in a one-to-one correspondence to the virtual pixel openings 320 in the planarization layer 200 positioned in the test region 10, and forming a barrier layer 400 in each of the barrier holes 210.

In one embodiment, the barrier layer 400 is formed in each of the barrier holes 210 by inkjet printing or other coating methods.

In one embodiment, the test region 10 is formed along an edge of the pixel definition layer 300 and is formed outside the display region 20. After forming the pixel definition layer 300 on the planarization layer 200, the method further includes:

forming a plurality of pixel openings 310 in the pixel definition layer 300 positioned in the display region 20.

In an embodiment, the pixel openings 310 and the virtual pixel openings 320 are manufactured by same process. It can be understood that the pixel openings 310 and the virtual pixel openings 320 are manufactured by a same photolithography process. An adopted mask has same opening size at the pixel opening 310 and at the virtual pixel opening 320, so that a size of the pixel opening 310 is equal to a size of the virtual pixel opening 320.

In an embodiment, the pixel openings 310, the virtual pixel openings 320, and the barrier holes 210 are made in a same photolithography process through a half-mask photomask. It can be understood that a process is adopted to make the virtual pixel openings 320 and the barrier holes 210 are integrally formed in the test region 10, and at the same time, the pixel openings 310 are formed in the display region 20 through a half-tone mask, so that each of the barrier holes 210 is connected to the corresponding virtual pixel opening 320, and an opening size of the barrier hole 210 close to a side of the pixel definition layer 300 is equal to an opening size of the virtual pixel opening 320 close to a side of the planarization layer 200; and a sidewall of the barrier hole 210 is in smooth transition with a sidewall of the corresponding virtual pixel opening 320.

In summary, a manufacturing method of a display panel provided in the present application, the barrier holes 210 and the barrier layer 400 can be manufactured in various ways, which can be suitable for large batch and large-scaled production. The pixel openings 310, the virtual pixel openings 320, and the barrier holes 210 are made in s same photolithography process through a half-mask photomask. This method simplifies the manufacturing of the barrier holes 210, and does not increase the procedure of the original display panel manufacturing process, simplifying the manufacturing process.

In summary, a display panel and a manufacturing method thereof provided in the present application are provided with a plurality of barrier holes 210 in a planarization layer 200 and a structure in which a barrier layer 400 is filled in each of the barrier holes 210, so that water-oxygen barrier regions are formed within the planarization layer 200. It can effectively enhance the encapsulating effect, also the abovementioned structure uses the film layer in the test region 10 reasonably, which is equivalent to increasing the effective area of the encapsulation. As a result, an area occupied by the subsequent encapsulating can be effectively reduced, and is more convenient for the narrow border design. In addition, the manufacturing method of the display panel is simple and suitable for batch production.

In the above embodiments, the description of each embodiment has its own emphasis. For a part that is not described in detail in one embodiment, reference can be made to related descriptions in other embodiments.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A display panel, comprising a test region,
wherein the display panel comprises a substrate, a planarization layer disposed on the substrate, and a pixel definition layer disposed on the planarization layer;

wherein a plurality of virtual pixel openings are disposed in the pixel definition layer positioned in the test region, a plurality of barrier holes in a one-to-one correspondence to the plurality of virtual pixel openings are disposed in the planarization layer positioned in the test region, and a barrier layer fills each of the plurality of barrier holes, wherein a material of the barrier layer is a hygroscopic agent, wherein the plurality of barrier holes and the barrier layer form spaced water-oxygen barrier regions in the test area;

wherein an opening size of each of the plurality of barrier holes close to a side of the pixel definition layer is equal to an opening size of the plurality of virtual pixel opening close to a side of the planarization layer; and wherein a thickness of the barrier layer is equal to a thickness of the planarization layer.

2. The display panel according to claim 1, further comprising a display region, wherein the test region extends from an edge of the pixel definition layer and surrounds the display region, and a plurality of pixel openings are disposed in the pixel definition layer positioned in the display region.

3. The display panel according to claim 2, wherein a size of each of the plurality of pixel openings is equal to a size of each of the plurality of virtual pixel openings.

4. The display panel according to claim 1, wherein each of the plurality of barrier holes is connected to a corresponding one of the plurality of virtual pixel openings.

5. A method of manufacturing a display panel, comprising the following steps:
  providing a substrate, wherein the display panel comprises a display region and a test region;
  forming a planarization layer on the substrate;
  forming a pixel definition layer on the planarization layer, and forming a plurality of virtual pixel openings in the test region on the pixel definition layer; and
  forming a plurality of barrier holes in a one-to-one correspondence to the plurality of virtual pixel openings in the planarization layer positioned in the test region, and forming a barrier layer in each of the plurality of barrier holes, wherein a material of the barrier layer is a hygroscopic agent, and wherein the plurality of barrier holes and the barrier layer form spaced water-oxygen barrier regions in the test area;

wherein an opening size of each of the plurality of barrier holes close to a side of the pixel definition layer is equal to an opening size of the plurality of virtual pixel opening close to a side of the planarization layer; and wherein a thickness of the barrier layer is equal to a thickness of the planarization layer.

6. The method of manufacturing the display panel according to claim 5, wherein said forming a barrier layer in each of the plurality of barrier holes is achieved by inkjet printing or other coating methods.

7. The method of manufacturing the display panel according to claim 5, wherein the test region is formed along an edge of the pixel definition layer and is formed outside the display region, and after the pixel definition layer is formed on the planarization layer, the method further comprises:
  forming a plurality of pixel openings in the pixel definition layer positioned in the display region.

8. The method of manufacturing the display panel according to claim 7, wherein the plurality of pixel openings and the plurality of virtual pixel openings are manufactured by a same process.

9. The method of manufacturing the display panel according to claim 7, wherein the plurality of pixel openings, the plurality of virtual pixel openings, and each of the plurality of barrier holes are made in a same photolithography process through a half-tone photomask.

\* \* \* \* \*